(12) United States Patent
Lee et al.

(10) Patent No.: US 12,713,931 B2
(45) Date of Patent: Aug. 18, 2026

(54) APPARATUS AND METHOD FOR SELECTIVELY FORMING A SHIELDING LAYER ON A SEMICONDUCTOR PACKAGE

(71) Applicant: STATS ChipPAC Pte. Ltd., Singapore (SG)

(72) Inventors: GunHyuck Lee, Incheon (KR); Yujeong Jang, Incheon (KR)

( * ) Notice: Subject to any disclaimer, the term of this patent is extended or adjusted under 35 U.S.C. 154(b) by 554 days.

(21) Appl. No.: 18/315,490

(22) Filed: May 10, 2023

(65) Prior Publication Data

US 2023/0378088 A1 Nov. 23, 2023

(30) Foreign Application Priority Data

May 19, 2022 (CN) ......................... 202210554141.2

(51) Int. Cl.
*H10W 42/20* (2026.01)
*H10W 74/01* (2026.01)
*H10W 74/10* (2026.01)

(52) U.S. Cl.
CPC ......... *H10W 42/20* (2026.01); *H10W 74/014* (2026.01); *H10W 74/114* (2026.01)

(58) Field of Classification Search
CPC . H01L 23/552; H01L 23/3121; H01L 21/561; H01L 23/04; H10W 74/114; H10W 42/276; H10W 42/20; H10W 42/287; H10W 74/014
USPC .......................................................... 257/659
See application file for complete search history.

(56) References Cited

U.S. PATENT DOCUMENTS 10,784,208 B2 9/2020 Liao et al.
2011/0089031 A1 4/2011 Cheng et al.
2020/0075502 A1* 3/2020 Kim ........................ H01L 23/66
2020/0211976 A1* 7/2020 Kim ........................ H01L 24/94
2021/0118810 A1 4/2021 Kim et al.
2022/0157739 A1* 5/2022 Lee ........................ H01L 21/56

FOREIGN PATENT DOCUMENTS

CN 1378408 A 11/2002
CN 114512408 A 5/2022
JP H08125326 A 5/1996
TW 201003882 1/2010
TW 201115233 A 5/2011

OTHER PUBLICATIONS

The Search Report for the counterpart Chinese patent application 202210554141.2, mailed on Nov. 10, 2025.

* cited by examiner

*Primary Examiner* — Didarul A Mazumder

(74) *Attorney, Agent, or Firm* — .Junhe Law Office, P.C.; Yi Zhang

(57) ABSTRACT

An apparatus for selectively forming a shielding layer on a semiconductor package is provided. The apparatus includes: a tray including a plurality of package seats, the tray defines, for each of the plurality of package seats, one or more sets of guide holes outside the package seat; deposition masks, each of the deposition masks includes: a set of pins releasably inserted within one set of the one or more sets of guide holes to place the deposition mask on the tray; and a cover attached to the set of pins, the cover is configured to cover at least a portion of an outer surface of a semiconductor package received within a package seat when the set of pins is inserted within the set of guide holes associated with the package seat; and a deposition source configured to deposit a shielding material.

10 Claims, 8 Drawing Sheets

231a
232a
233a
200
230a
250a
210a
220a

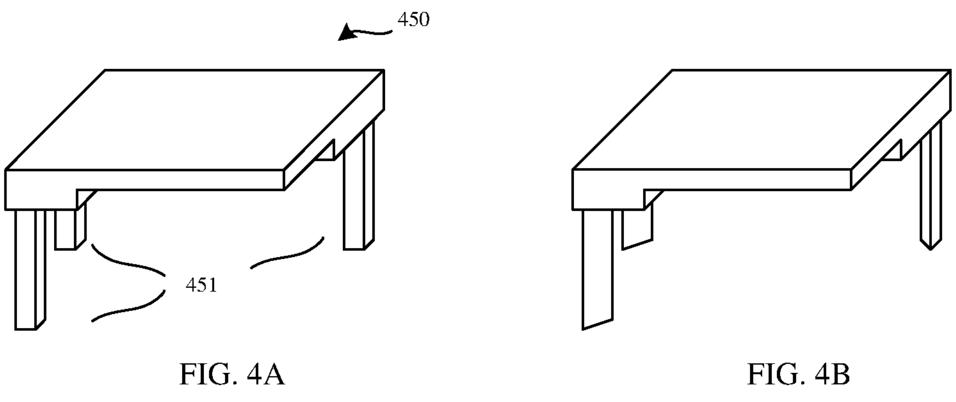
FIG. 4A
FIG. 4B
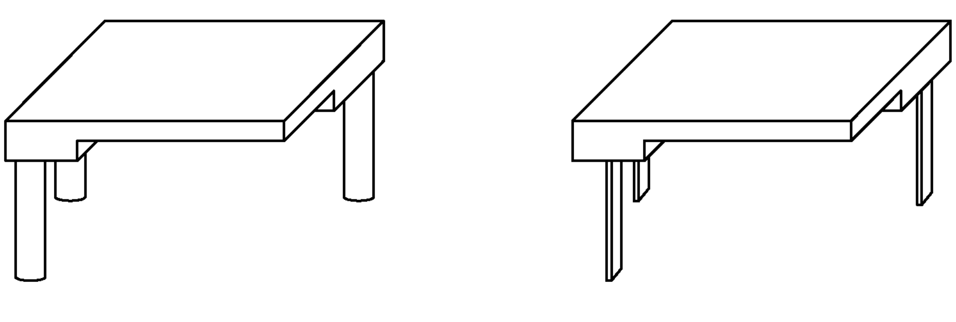
FIG. 4C
FIG. 4D
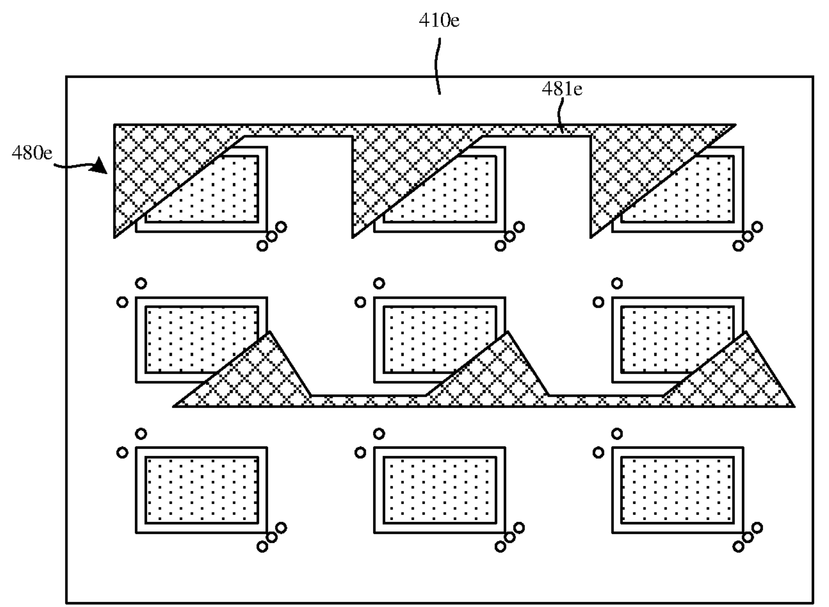
FIG. 4E

APPARATUS AND METHOD FOR SELECTIVELY FORMING A SHIELDING LAYER ON A SEMICONDUCTOR PACKAGE

TECHNICAL FIELD

The present application generally relates to semiconductor packaging technology, and more particularly, to an apparatus for selectively forming a shielding layer on a semiconductor package, and a method for performing the same.

BACKGROUND OF THE INVENTION

The semiconductor industry is constantly faced with complex integration challenges as consumers want their electronic products to be lighter, smaller and have higher performance with more and more functionalities. For sensitive electronic components in an electronic product, interference shielding needs to be performed to prevent disruption by electromagnetic field, electrostatic field, etc. Typically, a semiconductor package may be provided with a metal cover or a uniformly spread coating around its outer periphery as a shielding layer. In nearer cases where more electronic components are integrated in a single package, different components might need to be shielded differently. For example, a Magnetic Random Access Memory (MRAM) device may require local magnetic shielding since global shielding is neither cost-effective nor advantageous for heat dissipation. For another example, shielding may not be desired for antennas which need to transmit to and/or receive from the exterior space electromagnetic signals.

Therefore, a need exists for selectively forming a shielding layer on a semiconductor package.

SUMMARY OF THE INVENTION

An objective of the present application is to provide an apparatus for selectively forming a shielding layer on a semiconductor package.

According to an aspect of embodiments of the present application, an apparatus for selectively forming a shielding layer on a semiconductor package is provided. The apparatus may include: a tray including a plurality of package seats each being configured to receive a semiconductor package, wherein the tray defines, for each of the plurality of package seats, one or more sets of guide holes outside the package seat; deposition masks, wherein each of the deposition masks includes: a set of pins releasably inserted within one set of the one or more sets of guide holes to place the deposition mask on the tray; and a cover attached to the set of pins, wherein the cover is configured to cover at least a portion of an outer surface of a semiconductor package received within a package seat when the set of pins is inserted within the set of guide holes associated with the package seat; and a deposition source configured to deposit a shielding material onto the tray to form a shielding layer on each of the semiconductor packages when they are received in the plurality of package seats.

According to another aspect of embodiments of the present application, a method for selectively forming a shielding layer on a semiconductor package is provided. The method may include: providing a tray including a plurality of package seats, wherein the tray defines, for each of the plurality of package seats, one or more sets of guide holes outside the package seat; providing deposition masks, wherein each of the deposition masks includes a set of pins releasably inserted within one set of the one or more sets of guide holes to place the deposition mask on the tray; and a cover attached to the set of pins; placing a plurality of semiconductor packages within the respective package seats of the tray; placing the deposition masks on the tray by inserting the set of pins of each deposition mask within one set of the one or more sets of guide holes of a package seat so as to cover at least a portion of an outer surface of a semiconductor package received within the package seat; and depositing, via a deposition source, a shielding material onto the tray to form a shielding layer on each of the plurality of semiconductor packages.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIGS. 4A to 4D are perspective views of deposition masks with pins of different forms according to some embodiments of the present application.

FIGS. 4E and 4F are plan views of two forms of deposition masks that are connected with each other by exemplary connection frames according to some embodiments of the present application.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figures 1, 2A:
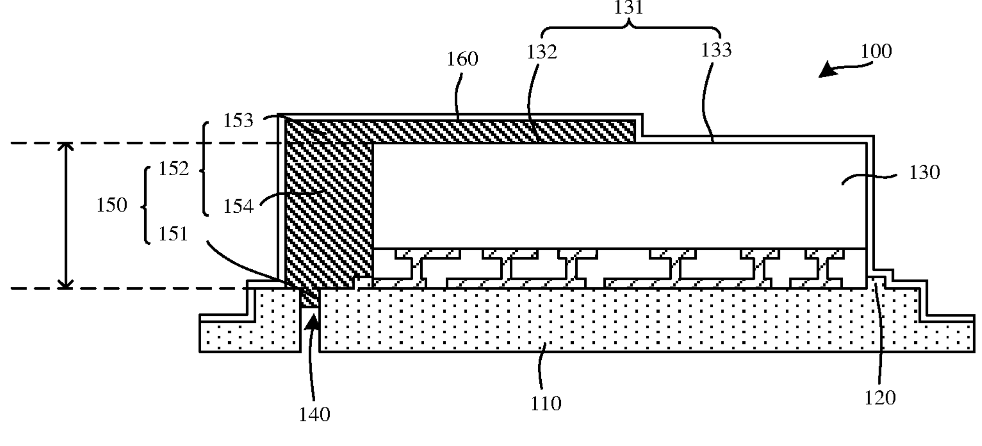
FIG. 1 is a cross-sectional view of an apparatus for selectively forming a shielding layer on a semiconductor package according to an embodiment of the present application.
FIGS. 2A to 2C are cross-sectional views of an apparatus for selectively forming a shielding layer on a semiconductor package with multiple alternative deposition mask covering configurations according to some embodiments of the present application.

FIG. 1 illustrates a cross-sectional view of an apparatus 100 for selectively forming a shielding layer on a semiconductor package according to an embodiment of the present application. In some embodiments, the apparatus 100 can be a physical vapor deposition apparatus such as a sputtering apparatus, which may include a deposition chamber that receives various components of the apparatus. For example, a target (i.e., a deposition source) can be disposed within the deposition chamber, which, upon ion or atom bombardment during a deposition process, ejects sputtered atoms onto a substrate within the deposition chamber to form a thin film on the substrate. A conductive casing or housing can be formed on a semiconductor package by the deposition apparatus 100 to function as shielding for reducing electromagnetic interferences to semiconductor devices within the semiconductor package. Furthermore, a selective shielding layer can be formed which does not cover an entirety of a top surface and lateral surfaces of the semiconductor package, as elaborated below with more details.

As shown in FIG. 1, the apparatus 100 includes a tray 110. The tray 110 works as the substrate for receiving semiconductor devices or packages where a thin film is desired to be formed. In some embodiments, the packages can be semiconductor packages singulated from a wafer-level package, all of which have the same or similar physical structure and may need forming the same thin film thereon. Accordingly, the tray 110 may have one or more package seats having the same structure as a package seat 120 shown in FIG. 1. In some embodiments, the tray 110 may be a flat plate, or a curved plate facing towards the target.

Each package seat 120 may receive a semiconductor package 130. The package seat 120 may take the form of a cavity with a cross section shaped as a rectangle, but aspects of the present application are not limited thereto. For example, the package seat 120 may be of a non-regular shape that is suitable to receive a semiconductor package. In some alternative examples, the package seat may be a flat support surface instead of a cavity. A set of guide hole(s) 140 can be formed outside the package seat 120 on the tray 110. In some embodiments, the guide holes 140 may be through holes. In some other embodiments, the guide holes 140 may not pass through the tray 110.

In order to selectively form a shielding layer for the semiconductor package 130 received within the package seat 120, a deposition mask 150 can be attached close to the package seat 120. In particular, the deposition mask 150 includes a set of pin(s) 151 and a cover 152. The set of pins 151 may be releasably inserted within the set of guide holes 140 to place the deposition mask 150 on the tray 110. In particular, as shown in the apparatus 100, the deposition mask 150 is attached to the tray 110 after the semiconductor package 130 is placed within the package seat 120, but the order of placing the deposition mask 150 and placing the semiconductor package 130 is not limited thereto, as elaborated in some other embodiments. The cover 152 is attached to the set of pins 151, and the cover 152 may cover at least a portion 132 of an outer surface 131 of the semiconductor package 130 when the semiconductor package 130 is received within the package seat 120. Specifically, as shown in the apparatus 100, the cover 152 of the deposition mask 150 may include a top portion 153, which may cover at least a portion of a top surface of the semiconductor package 130. The cover 152 may further include a bottom portion 154 which extends between the top portion 153 and the pin 151. The bottom portion 154 may cover at least a portion of a lateral surface of the semiconductor package 130. The height of the bottom portion 154 may be equal to a thickness of the semiconductor package 130. Aspects of the present application are not limited thereto. Preferably, the inner surface of the deposition mask 150 may entirely cling to the outer surface 131 of the semiconductor package 130 without space in between, thereby the inner surface of the deposition mask 150 clings to the covered portion 132 of the outer surface 131 of the semiconductor package 130 by the deposition mask 150. In the apparatus 100, the cover 152 clings to a portion of an upper surface and a lateral surface of the semiconductor package 130, but the shape and position of the covered portion 132 of the outer surface 131 of the semiconductor package 130 may not be limited thereto, as elaborated below with reference to some other embodiments of the present application.

As aforementioned, to protect a semiconductor package from interference such as thermal shock, chemical attack, physical attack, and fluid penetration, shielding material(s) such as metals, conducting plastics and conducting polymers may be deposited onto the semiconductor package 130. Multiple electronic components may be integrated in a semiconductor package, and different electronic components may require different shielding configurations. As a shielding material is being deposited onto the tray 110 to form a shielding layer 160 on the semiconductor package 130, an exposed portion 133 of the outer surface 131 of the semiconductor package 130 is formed with a shielding layer while the portion 132 covered by the deposition mask 150 remains not formed with a shielding layer when the deposition mask 150 is removed off the tray 110.

Figure 2B:
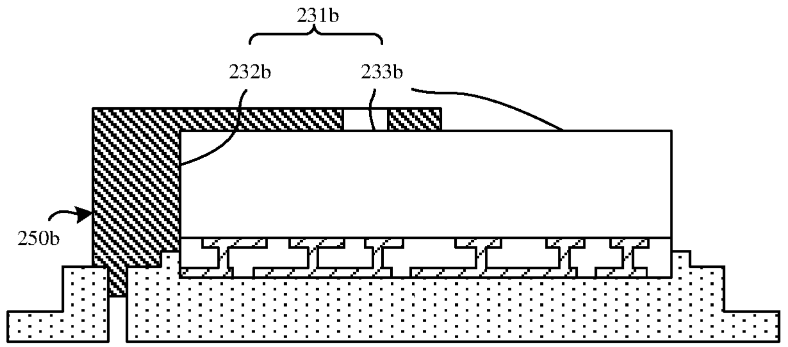
Figure 2C:
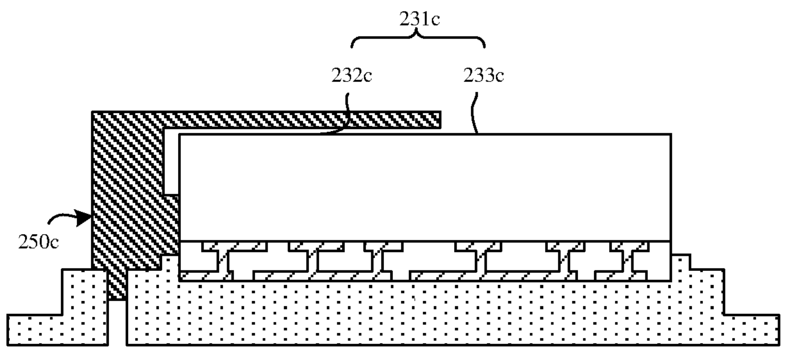

FIGS. 2A to 2C are cross-sectional views of an apparatus 200 for selectively forming a shielding layer on a semiconductor package with multiple alternative deposition mask covering configurations according to some embodiments of the present application.

As shown in FIGS. 2A to 2C, several configurations for covering respective semiconductor packages which are different from the configuration shown in FIG. 1 are shown. Deposition masks 250*a*, 250*b* and 250*c* may cover portions 232*a*, 232*b* and 232*c* of the respective semiconductor packages in different positions and with different shapes. In this way, uncovered portions 233*a*, 233*b* and 233*c* of outer surfaces of the respective semiconductor packages may be formed with a shielding layer. As shown in FIG. 2A, the deposition mask 250*a* may partially cover only a lateral surface 232*a* of an outer surface 231*a* of a semiconductor package 230*a*, and a top surface of the semiconductor package 230*a* may remain not covered and thus be formed with a shielding layer. In the embodiment shown in FIG. 2A, the semiconductor package 230*a* may be inserted into a package seat 220*a* from above, regardless of the attachment of the deposition mask 250*a* to a tray 210*a*. Therefore, the deposition mask 250*a* may be attached to the tray 210*a* before, after or at the same time that the semiconductor package 230*a* is inserted into the package seat 220*a*. In FIG. 2B, the deposition mask 250*b* may include one or more holes, thereby exposing multiple portions 233*b* of an outer surface 231*b* of a semiconductor package. The exposed portion 233*b* may include multiple portions of the outer surface 231*b* that are not connected to each other. FIG. 2C illustrates an embodiment where the deposition mask 250*c* may not entirely cling to an outer surface 231*c* of a semiconductor package, thereby leaving space between the inner surface of the deposition mask 250*c* and the covered portion 232*c* of the outer surface 231*c*. In that case, the surface 232*c* which is covered by the deposition mask 250*c* but not in contact with its cover may not be formed with the shielding layer, or may be formed with a thinner shielding layer, depending on the type of the deposition process (e.g., anisotropic deposition or isotropic deposition).

Figure 2D:
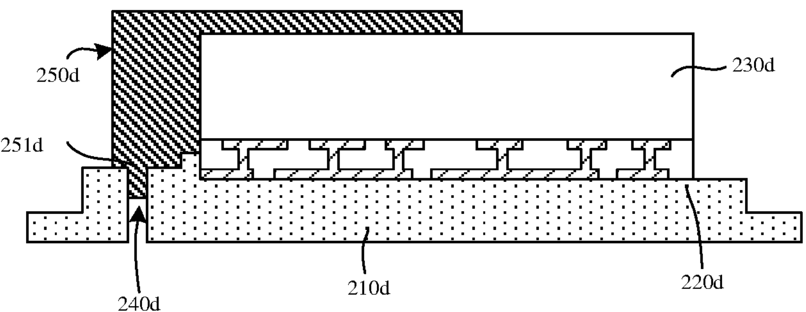
FIG. 2D illustrates a cross-sectional view of an apparatus for selectively forming a shielding layer on a semiconductor package with a half-open package seat configuration according to an embodiment of the present application.

FIG. 2D illustrates a cross-sectional view of an apparatus for selectively forming a shielding layer on a semiconductor package with a half-open package seat configuration according to another embodiment of the present application.

In the embodiment shown in FIG. 2D, a package seat 220*d* may be semi-open to allow insertion of a semiconductor package 230*d* into the package seat 220*d*, even if a deposition mask 250*d* is already attached to a tray 210*d* by inserting a set of pin(s) 251*d* into guide holes 240*d*. In an embodiment, a fastener may further hold the semiconductor package 230*d* in place after it is horizontally inserted into the package seat 220*d*, for example, by blocking the opening (to the right of the package seat shown in FIG. 2D) of the semi-open package seat 220*d*. As such, in the case illustrated in FIG. 2D, the deposition mask 250*d* may be attached to the tray 210*d* before, after or at the same time that the semiconductor package 230*d* is received by the package seat 220*d*. It can be appreciated that the specific order of attaching the semiconductor package and the deposition mask onto the tray can be adjusted based on the configurations of the deposition mask and the package seat.

Figure 2E:
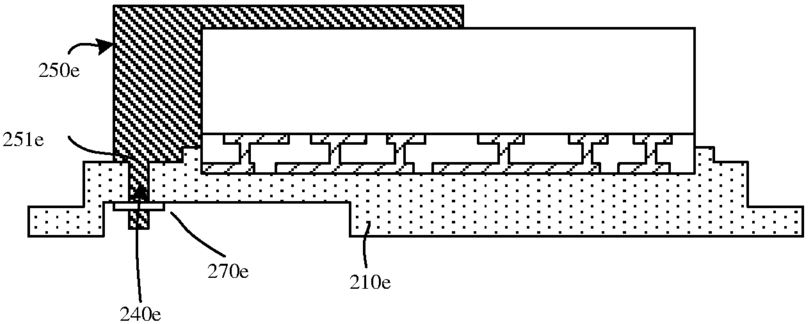
FIG. 2E illustrates a cross-sectional view of an apparatus with a fastener for selectively forming a shielding layer on a semiconductor package according to an embodiment of the present application.

FIG. 2E illustrates a cross-sectional view of an apparatus with a fastener for selectively forming a shielding layer on a semiconductor package according to another embodiment of the present application.

As shown in FIG. 2E, a deposition mask 250*e* may be secured to a tray 210*e* by a fastener 270*e*. The fastener 270*e* is mechanically coupled with one of a set of pin(s) 251*e* of the deposition mask 250*e* such that the fastener 270*e* can apply a force on the deposition mask 250*e* against the movement of the deposition mask 250*e* after the pins 251*e* of the deposition mask 250*e* are inserted into respective guide holes 240*e*. In some embodiments, the fastener 270*e* may be a nut or ring which has a width larger than a diameter of the guide hole 240*e*. The fastener 270*e* may mate with a bolt structure at a bottom of the pin 251*e* that extends through the tray 210*e* out of the guide hole 240*e*. In can be appreciated that the fastener 270*e* may be omitted in some embodiments.

Figure 3:
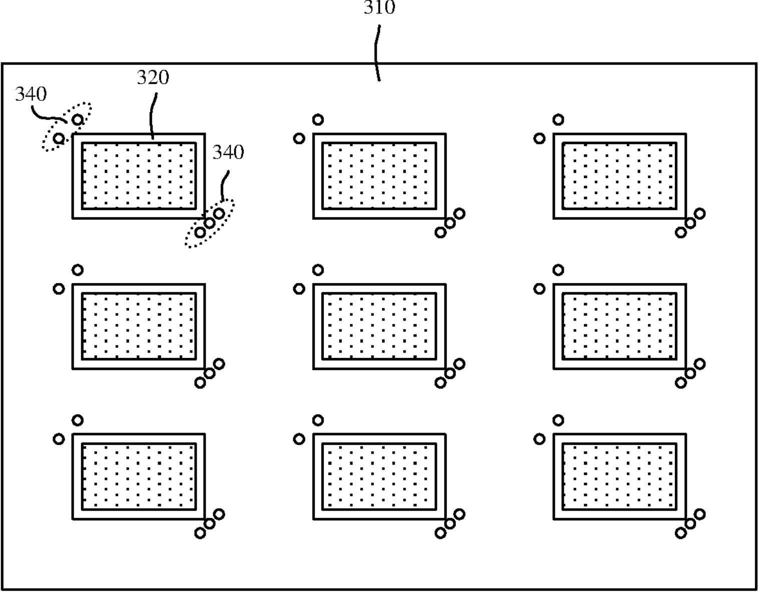
FIG. 3 is a plan view illustrating a tray having a plurality of semiconductor package seats with sets of guide holes outside the seats according to an embodiment of the present application.

FIG. 3 illustrates a plan view of a tray having a plurality of semiconductor package seats with sets of guide holes outside the seats according to an embodiment of the present application. The tray can be any of the trays shown in FIG. 1 and FIGS. 2A to 2E.

Referring to FIG. 3, a tray 310 may include a plurality of package seats 320, and each package seat 320 may receive a semiconductor package. The material of the tray 310 may be conductive, anti-static, strong, and heat tolerant for safe handling, transport, and storage of semiconductor packages. Tray material may be modified polyphenylene oxide (MPPO), polyphenylene ether (PPE), polysulfone (PSU), modified polysulfone (MPSU), polyethersulfone (PES), etc. The tray 310 may be made of metal to improve the thermal conductivity of the apparatus. One or more sets of guide holes 340 may be configured outside each package seat 320. In the illustration, for each package seat 320, the guide holes 340 may be disposed around a corner of the package seat 320, but aspects of the present application are not limited thereto. The position, number and shape of the one or more sets of guide holes 340 may be differently configured. For example, as shown in FIG. 3, a set of two guide holes are formed at an upper left corner of the package seat 320, and another set of three guide holes are formed at a lower right corner of the package seat 320. It is preferred to include two or more guide holes in a set of guide holes to prevent any lateral movement of a deposition mask relative to a package seat.

FIGS. 4A to 4D are perspective views of deposition masks with pins of different forms according to some embodiments of the present application.

Referring to FIGS. 4A to 4D, a set of pin(s) of a deposition mask may take different forms. For example, as shown in FIG. 4A, each of pins 451 of a deposition mask 450 may have a cross section shaped as a square. As shown in FIG. 4B to 4D, each pin of a deposition mask may also have a cross section shaped as a triangle, a circle, an oval, a rectangle. As such, a non-circular shaped pin can prevent a lateral movement of a deposition mask relative to a package seat, if only one pin is included in a guide pin set. It can be appreciated that a deposition mask may have pins of different forms.

Figure 4F:
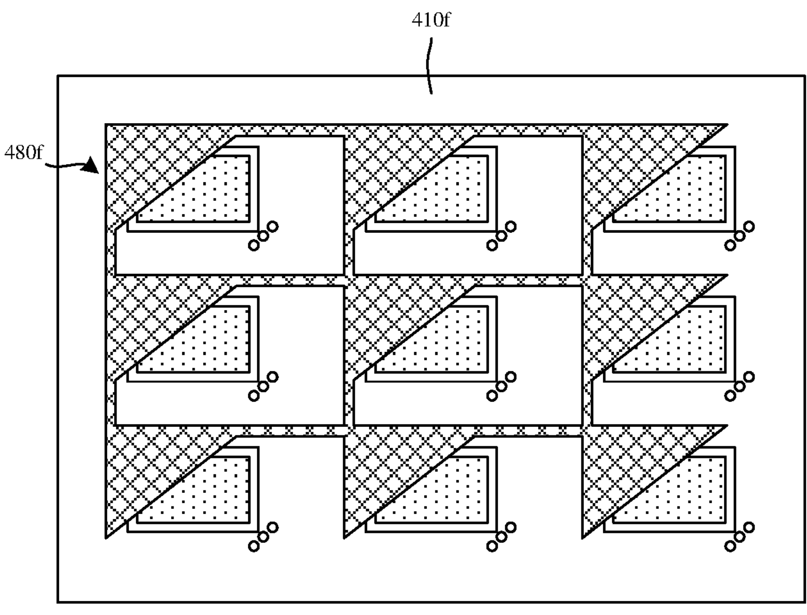

FIGS. 4E and 4F are plan views of two forms of deposition masks that are connected with each other by exemplary connection frames according to some embodiments of the present application. The deposition masks along with the connection frames can be placed on a tray. For example, the deposition masks can be any of the deposition masks shown in FIG. 4A to 4D, and the tray can be any of the trays shown in FIG. 1 and FIGS. 2A to 2E.

Referring to FIG. 4E, a connection frame 481*e* may connect three deposition masks with each other. For example, as shown in FIG. 4E, the connection frame 481*e* may be connected at an end to a right corner of a cover of a left deposition mask, and be connected at another end to a left lateral edge of a cover of an adjacent right deposition mask in a row. The connection frame 481*e* does not overlay with the semiconductor packages on a tray 410*e*. In this way, the connection frame 481*e* and the connected deposition masks form a deposition mask assembly 480*e* placed on a row of package seats on the tray 410*e*. Aspects of the present disclosure are not limited thereto. It can be appreciated that the connection frame can be connected to other positions or parts of a deposition mask, so long as the connection formed with the connection frame does not interfere with the desired shielding pattern. It can also be appreciated that the connection frame may connect deposition masks corresponding to a row, a column, a section or all of the package seats of a tray.

Further referring to FIG. 4E, two rows of semiconductor packages placed on the tray 410*e* may require different shielding configurations. For example, the semiconductor packages received within the first row of the package seats may require a shielding pattern that excludes an upper left triangle portion, while the semiconductor packages in the second row may require a shielding pattern that excludes a lower right triangle portion, and semiconductor packages placed in the third row may require an entire shielding layer. As such, the connection frame 481*e* may be connected to the deposition masks forming the same shielding pattern, i.e., in the same row. It can be appreciated that the connection frame may also be connected to deposition masks with different shielding patterns. In another embodiment, all semiconductor packages received within the package seats of a tray may require different shielding patterns and thereby require different deposition masks. The different deposition masks may also be connected with a connection frame for disposing the connected deposition masks on the tray at the same time. The connected deposition masks may correspond to a row, a column, a section of the package seats or even all the package seats.

Referring to FIG. 4F, all the deposition masks placed on a tray 410 are connected together via a single connection frame, forming a gridded deposition mask assembly 480*f*. In some embodiments, the connection frame may be integrally formed with the deposition masks. In some other embodiments, the connection frame can be a component formed separately from the deposition masks, and can be assembled with the depositions masks before a shielding deposition process. In this way, all the deposition masks of the deposition mask assembly 480*f* may be placed on and/or unload from the tray 410*f* at the same time.

Figure 5:
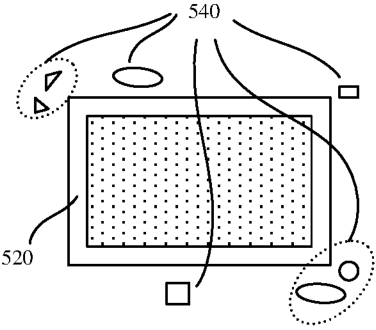
FIG. 5 is a plan view illustrating a semiconductor package seat and several sets of guide holes in its vicinity with different shapes according to an embodiment of the present application.

FIG. 5 illustrates a plan view of a semiconductor package seat and several sets of guide holes in its vicinity with different shapes according to an embodiment of the present application.

Referring to FIG. 5, outside a semiconductor package seat 520, one or more sets of guide holes 540 of different forms and different positions may be configured. As illustrated, the cross section of the guide holes 540 may take various shapes such as a triangle, a circle, an oval, a rectangle and a square. Aspects of the present application are not limited thereto. The position of the guide holes may be configured according to specific situations in industrial production.

Figure 6:
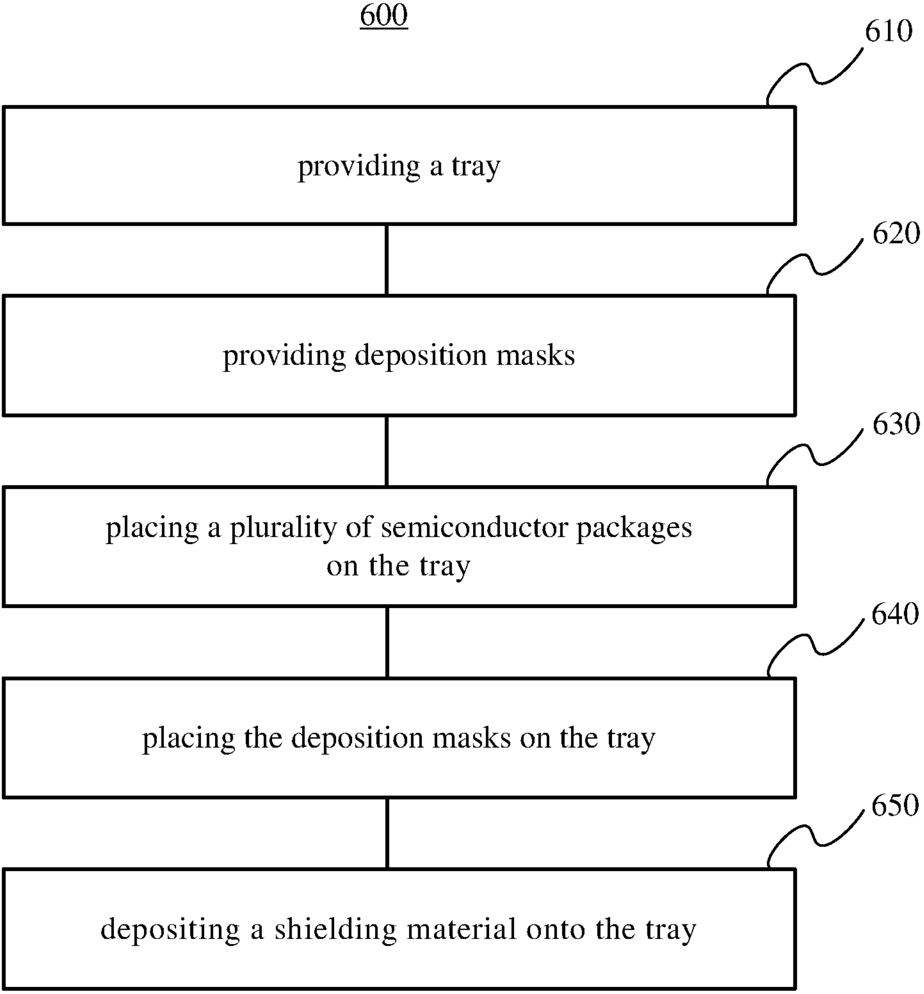
FIG. 6 is a flowchart illustrating a method for selectively forming a shielding layer on a semiconductor package according to an embodiment of the present application.

FIG. 6 illustrates a flowchart of a method 600 for selectively forming a shielding layer on a semiconductor package according to an embodiment of the present application.

As shown in FIG. 6, the method 600 starts with blocks 610 and 620, wherein a tray and a plurality of deposition masks are provided. As shown in block 630 and 640, semiconductor packages and deposition masks may be placed on a tray. In this illustration, the deposition masks may be provided antecedently as in block 620, then may follow the placement of a plurality of semiconductor packages as shown in block 630, and the deposition masks may be placed subsequently as shown in block 640, but aspects of the present application are not limited thereto. For example, the deposition masks could be placed on the tray beforehand, and the semiconductor packages may be placed on the tray afterwards in the case that the space formed by the deposition masks and the tray allows a positioning of the semiconductor packages, which could refer to the embodiments shown in FIGS. 2A and 2D, for example. In another embodiment, the placement of the plurality of semiconductor packages may be antecedent, then the deposition masks may be provided, the deposition masks may be placed subsequently. The present disclosure is not limited to the order of the method illustrated in the diagram. Afterwards, as shown in block 650, a deposition source deposits a shielding material onto the tray to form a shielding layer on the plurality of semiconductor packages and the depositions masks. Each deposition mask covers partially the respective semiconductor package to prevent the forming of the shielding layer on the covered surfaces of the semiconductor package. After the deposition in block 650, the deposition masks can be removed from the tray.

FIGS. 7A to 7D are cross-sectional views illustrating various steps of the method for selectively forming a shielding layer on a semiconductor package illustrated in FIG. 6 according to an embodiment of the present application.

Figure 7A:
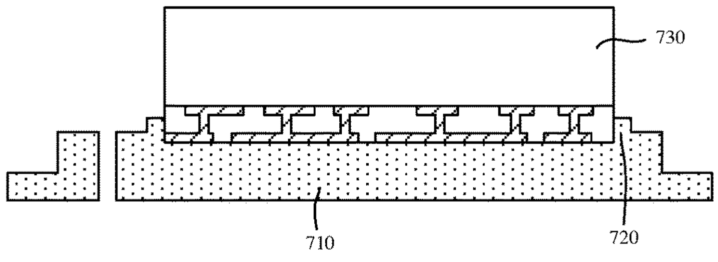
FIGS. 7A to 7D are cross-sectional views illustrating various steps of the method for selectively forming a shielding layer on a semiconductor package illustrated in FIG. 6 according to an embodiment of the present application.
Figure 7B:
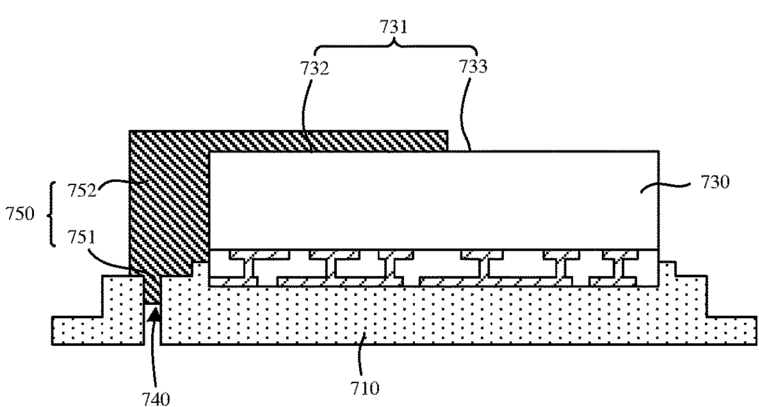

As shown in FIG. 7A, a semiconductor package 730 is firstly placed in a package seat 720 configured on a tray 710. As shown in FIG. 7B, a deposition mask 750, which has a cover 752 and a set of pin(s) 751, is disposed on the tray 710 by inserting the releasable pin 751 into a guide hole 740 on the tray 710. The pin 751 may take various forms such as a pillar with a cross section of a rectangle, a square, a circle, an oval, a triangle, etc. The form of the pin 751 may be configured as stated in the illustration of FIGS. 4A to 4D, for example. The deposition mask 750 may also be one deposition mask connected via a connection frame to another deposition mask as stated in the illustration of FIGS. 4E and 4F. The guide hole 740 is a through hole but it may take various other forms such as a cavity. The deposition mask 750 may further include a fastener attachable to the pin 751 to secure the connection between the deposition mask 750 and the tray 710.

Further referring to FIG. 7B, the deposition mask 750 may cling to one or more faces of the semiconductor package 730. The cover 752 of the deposition mask 750 may form a cavity having an inner surface, and the inner surface may conform to at least a portion 732 of an outer surface 731 of the semiconductor package 730. At the same time, at least a portion 733 of the outer surface 731 remains exposed to an external environment. The deposition mask 750 may take various forms, and there may or may not be space between the deposition mask 750 and the semiconductor package 730.

Figure 7C:
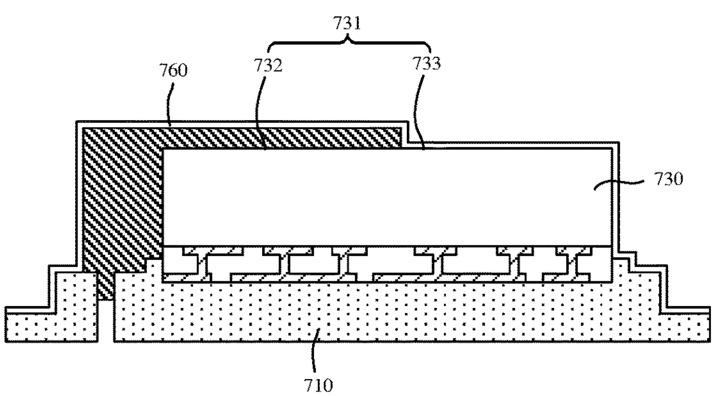

Further referring to FIG. 7C, a shielding layer 760 is formed by depositing shielding material onto the tray 710 from a deposition source. The covered portion 732 of the surface 731 of the semiconductor package 730 remains not shielded, while the exposed portion 733 of the surface 731 of the semiconductor package 730 is then shielded by the shielding layer 760.

Figure 7D:
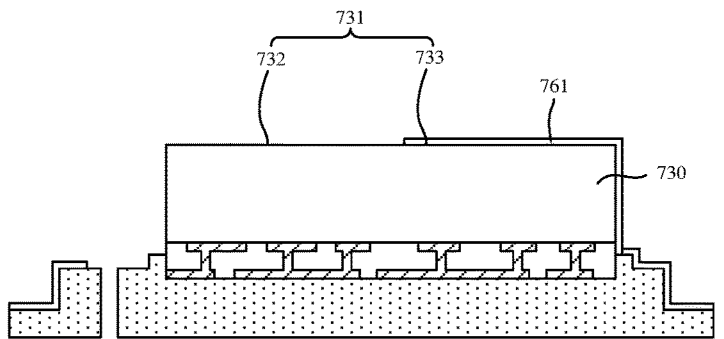

Further referring to FIG. 7D, after the removal of the deposition mask shown in FIG. 7C, the covered portion 732 of the surface 731 of the semiconductor package 730 is exposed to the external environment with no shielding layer thereon, while the exposed portion 733 of the surface 731 is shielded. In this way, the method may form a selective shielding layer 761 on the partial surface 733 of the semiconductor package 730. Since deposition masks are releasably attached to a tray, after unloading the deposition masks and the respective semiconductor packages from the tray, the tray and the deposition masks may be reused, which is more cost-effective compared to traditional shielding process that requires one-time subsidiary material such as polyimide tape and metal frame. Therefore, the method according to the embodiment of the present application defines a selectively forming shielding solution with flexibility and cost efficiency.

Figures 8A, 8B, 8C:
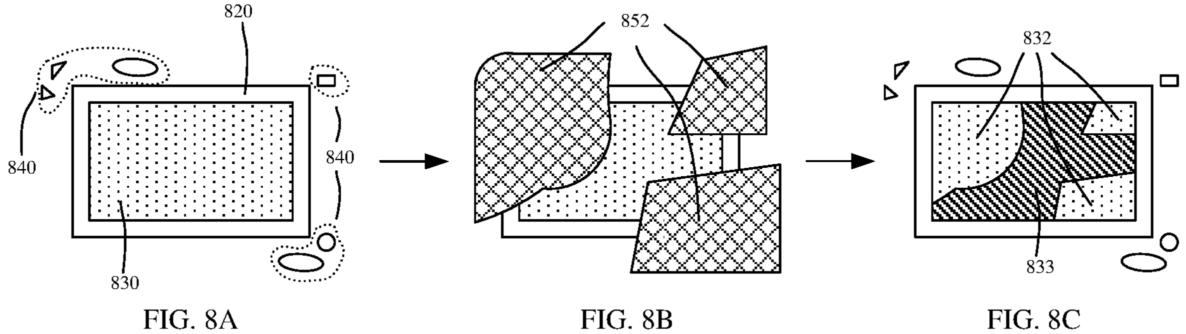
FIGS. 8A to 8C are plan views illustrating steps of selectively forming a rounded shielding layer onto a semiconductor package according to an embodiment of the present application.

In some embodiments, it may be desired to form irregular shaped shielding layer on a semiconductor package, and accordingly the cover of a deposition mask can be constructed to have a similar shape to the desired shape. FIGS. 8A to 8C are plan views illustrating steps of selectively forming a shielding layer with a curved shape on a semiconductor package according to an embodiment of the present application.

Referring to FIG. 8A, a package seat 820 having three sets of guide holes 840 may be provided on a tray (not shown). A semiconductor package 830 may be placed within the package seat 820. As shown in FIG. 8B, three deposition masks having three respective covers 852 may be placed over the package seat 820 to shield three corners of a surface of the semiconductor package 830. It can be seen that it is flexible to form a shielding layer of more complex patterns such as a curved pattern shown in FIG. 8B. Aspects of the present application are not limited thereto. The deposition mask may also be designed to cover a portion of a top surface and/or a portion of a lateral surface of the semiconductor package 830. Afterwards, as shown in FIG. 8C, after removal of the deposition masks, three non-shielded regions 832 and a central shielding layer 833 are formed at least on a top surface of the semiconductor package 830.

The discussion herein included numerous illustrative figures that showed various apparatus for selectively forming a shielding layer on a semiconductor package and method of performing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. An apparatus for selectively forming a shielding layer on a semiconductor package, comprising:

a tray comprising a plurality of package seats each being configured to receive the semiconductor package, wherein the tray defines each of the plurality of package seats, one or more sets of guide holes outside the plurality of package seats;

deposition masks, wherein each of the deposition masks comprises:

a set of pins releasably inserted within one set of the one or more sets of guide holes to place the deposition mask on the tray; and a cover attached to the set of pins, wherein the cover is configured to cover at least a portion of an outer surface of the semiconductor package received within the plurality of package seats when the set of pins is inserted within the one or more sets of guide holes associated with the plurality of package seats; and a deposition source configured to deposit a shielding material onto the tray to form the shielding layer on the semiconductor packages when received in the plurality of package seats.

2. The apparatus of claim 1, wherein the cover of each of the deposition masks comprises:

a top portion configured to at least partially cover a top surface of the semiconductor package; and a bottom portion extending between the top portion and the set of pins, wherein the bottom portion is configured to cover at least a portion of a lateral surface of the semiconductor package.

3. The apparatus of claim 2, wherein the bottom portion has a height equal to a thickness of the semiconductor package.

4. The apparatus of claim 1, further comprising a connection frame for connecting two or more of the deposition masks with each other.

5. The apparatus of claim 4, wherein the connection frame is further configured to connect all of the deposition masks with each other, and the connection frame is integrally formed with the deposition masks.

6. The apparatus of claim 4, wherein the connection frame is further configured to connect two or more of the deposition masks with each other such that the connected deposition masks correspond to a row, a column, a section or all of the plurality of package seats.

7. The apparatus of claim 1, wherein each set of the one or more sets of guide holes are disposed around a corner of a corresponding package seat.

8. The apparatus of claim 1, wherein the cover defines a cavity having an inner surface, and wherein the inner surface clings to a covered portion of an outer surface of the semiconductor package received within the plurality of package seats.

9. The apparatus of claim 1, wherein each deposition mask further comprises:

a set of fasteners mechanically coupled to the set of pins, respectively, to secure the deposition masks to the tray.

10. The apparatus of claim 1, wherein the one or more sets of guide holes are through-holes.

* * * * *